(12) United States Patent
Larose et al.

(10) Patent No.: US 11,518,143 B2
(45) Date of Patent: Dec. 6, 2022

(54) OXIDATION-RESISTANT COATED SUPERALLOY

(71) Applicant: Pratt & Whitney Canada Corp., Longueuil (CA)

(72) Inventors: Joel Larose, Longueuil (CA); Alan D. Cetel, West Hartford, CT (US); David A. Litton, West Hartford, CT (US); Brian S. Tryon, Redwood City, CA (US)

(73) Assignee: Pratt & Whitney Canada Corp., Longueuil (CA)

( * ) Notice: Subject to any disclaimer, the term of this patent is extended or adjusted under 35 U.S.C. 154(b) by 0 days.

(21) Appl. No.: 17/029,572

(22) Filed: Sep. 23, 2020

(65) Prior Publication Data

US 2021/0001603 A1 Jan. 7, 2021

Related U.S. Application Data

(62) Division of application No. 16/177,974, filed on Nov. 1, 2018, now abandoned, which is a division of (Continued)

(51) Int. Cl.
*B32B 15/01* (2006.01)
*B32B 15/04* (2006.01)
(Continued)

(52) U.S. Cl.
CPC .............. *B32B 15/01* (2013.01); *B32B 15/04* (2013.01); *B32B 15/043* (2013.01); *C22C 5/04* (2013.01);
(Continued)

(58) Field of Classification Search
CPC ....... C22C 19/057; C22C 19/03; C22C 19/05; C22C 19/051; C22C 5/04; C22C 30/00;
(Continued)

(56) References Cited

U.S. PATENT DOCUMENTS 4,346,137 A 8/1982 Hecht
4,388,124 A 6/1983 Henry
(Continued)

FOREIGN PATENT DOCUMENTS

EP 0207874 A2 1/1987
EP 0913506 A1 5/1999
(Continued)

OTHER PUBLICATIONS

Didier Argence et al., MC-NG: A 4th Generation Single-Crystal Superalloy for Future Aeronautical Turbine Blades and Vanes, Superalloys 2000, Sep. 2000, pp. 829-837, TMS (The Minerals, Metals & Materials Society), Warrendale, Pennsylvania.
(Continued)

*Primary Examiner* — Michael E. La Villa
(74) *Attorney, Agent, or Firm* — Bachman & LaPointe, P.C.

(57) ABSTRACT

A coating-substrate combination includes: a Ni-based superalloy substrate comprising, by weight percent: 2.0-5.1 Cr; 0.9-3.3 Mo; 3.9-9.8 W; 2.2-6.8 Ta; 5.4-6.5 Al; 1.8-12.8 Co; 2.8-5.8 Re; 2.8-7.2 Ru; and a coating comprising, exclusive of Pt group elements, by weight percent: Ni as a largest content; 5.8-9.3 Al; 4.4-25 Cr; 3.0-13.5 Co; up to 6.0 Ta, if any; up to 6.2 W, if any; up to 2.4 Mo, if any; 0.3-0.6 Hf; 0.1-0.4 Si; up to 0.6 Y, if any; up to 0.4 Zr, if any; up to 1.0 Re, if any.

19 Claims, 19 Drawing Sheets

US 11,518,143 B2
Page 2

Related U.S. Application Data application No. 13/969,689, filed on Aug. 19, 2013, now abandoned.

(60) Provisional application No. 61/785,596, filed on Mar. 14, 2013, provisional application No. 61/720,155, filed on Oct. 30, 2012, provisional application No. 61/691,223, filed on Aug. 20, 2012.

(51) Int. Cl.
| | |
|---|---|
| *C23C 30/00* | (2006.01) |
| *C23C 14/02* | (2006.01) |
| *C23C 14/16* | (2006.01) |
| *C23C 14/58* | (2006.01) |
| *C23C 14/14* | (2006.01) |
| *C23C 28/00* | (2006.01) |
| *C23C 28/02* | (2006.01) |
| *C22C 5/04* | (2006.01) |
| *C22C 19/05* | (2006.01) |
| *C22C 19/03* | (2006.01) |
| *C22C 30/00* | (2006.01) |
| *F01D 5/28* | (2006.01) |

(52) U.S. Cl.
CPC .............. *C22C 19/03* (2013.01); *C22C 19/05* (2013.01); *C22C 19/051* (2013.01); *C22C 19/057* (2013.01); *C22C 30/00* (2013.01); *C23C 14/025* (2013.01); *C23C 14/14* (2013.01); *C23C 14/16* (2013.01); *C23C 14/165* (2013.01); *C23C 14/58* (2013.01); *C23C 14/5806* (2013.01); *C23C 28/022* (2013.01); *C23C 28/32* (2013.01); *C23C 28/321* (2013.01); *C23C 28/3215* (2013.01); *C23C 28/3455* (2013.01); *C23C 30/00* (2013.01); *C23C 30/005* (2013.01); *F01D 5/28* (2013.01); *F01D 5/288* (2013.01); *Y10T 428/12875* (2015.01); *Y10T 428/12931* (2015.01); *Y10T 428/12937* (2015.01); *Y10T 428/12944* (2015.01)

(58) Field of Classification Search
CPC ..... C23C 14/025; C23C 14/165; C23C 14/58; C23C 14/5806; C23C 14/14; C23C 14/16; C23C 28/32; C23C 28/321; C23C 28/3215; C23C 28/3455; C23C 28/022; C23C 30/00; C23C 30/005; B32B 15/01; B32B 15/04; B32B 15/043; Y10T 428/12931; Y10T 428/12937; Y10T 428/12944; Y10T 428/12875; F01D 5/28; F01D 5/288
See application file for complete search history.

(56) References Cited

U.S. PATENT DOCUMENTS

| | | | |
|---|---|---|---|
| 4,399,199 A | 8/1983 | McGill et al. | |
| 4,585,481 A | 4/1986 | Gupta et al. | |
| 4,615,865 A | 10/1986 | Duvall et al. | |
| 4,643,782 A | 2/1987 | Harris et al. | |
| 4,719,080 A | 1/1988 | Duhl et al. | |
| 4,758,480 A | 7/1988 | Hecht et al. | |
| 4,830,679 A | 5/1989 | Yamagata et al. | |
| 4,935,072 A | 6/1990 | Nguyen-Dinh | |
| 5,270,123 A | 12/1993 | Walston et al. | |
| 5,334,263 A | 8/1994 | Schaeffer | |
| 5,482,789 A | 1/1996 | O'Hara et al. | |
| 5,489,346 A | 2/1996 | Erickson | |
| 5,498,484 A | 3/1996 | Duderstadt | |
| 5,540,790 A | 7/1996 | Erickson | |
| 5,658,614 A | 8/1997 | Basta et al. | |
| 5,667,663 A | 9/1997 | Rickerby et al. | |
| 5,687,679 A | 11/1997 | Mullin et al. | |
| 5,695,821 A | 12/1997 | Murphy et al. | |
| 5,716,720 A | 2/1998 | Murphy | |
| 5,837,385 A | 11/1998 | Schaeffer et al. | |
| 5,856,027 A | 1/1999 | Murphy | |
| 5,916,382 A | 6/1999 | Sato et al. | |
| 5,935,353 A | 8/1999 | Murphy et al. | |
| 6,001,492 A | 12/1999 | Jackson et al. | |
| 6,007,645 A | 12/1999 | Cetel et al. | |
| 6,159,314 A | 12/2000 | Koizumi et al. | |
| 6,190,471 B1 | 2/2001 | Darolia et al. | |
| 6,306,524 B1 | 10/2001 | Spitsberg et al. | |
| 6,410,153 B1 | 6/2002 | Broomfield et al. | |
| 6,435,826 B1 | 8/2002 | Allen et al. | |
| 6,435,835 B1 | 8/2002 | Allen et al. | |
| 6,447,932 B1 | 9/2002 | O'Hara et al. | |
| 6,585,878 B2 | 7/2003 | Strangman et al. | |
| 6,632,299 B1 | 10/2003 | Harris | |
| 6,641,929 B2 | 11/2003 | Kelly et al. | |
| 6,673,308 B2 | 1/2004 | Hino et al. | |
| 6,706,241 B1 | 3/2004 | Baumann et al. | |
| 6,720,088 B2 | 4/2004 | Zhao et al. | |
| 6,746,782 B2 | 6/2004 | Zhao et al. | |
| 6,755,921 B2 | 6/2004 | Kobayashi et al. | |
| 6,919,042 B2 | 7/2005 | Beers et al. | |
| 6,921,586 B2 | 7/2005 | Zhao et al. | |
| 6,929,868 B2 | 8/2005 | Kelly et al. | |
| 6,966,956 B2 | 11/2005 | Koizumi et al. | |
| 6,974,636 B2 | 12/2005 | Darolia et al. | |
| 7,214,409 B1 | 5/2007 | Kasule | |
| 7,261,783 B1 | 8/2007 | Mackay et al. | |
| 7,361,302 B2 | 4/2008 | Beers et al. | |
| 7,704,332 B2 | 4/2010 | Seetharaman et al. | |
| 8,221,901 B2 | 7/2012 | Harada et al. | |
| 8,252,430 B2 | 8/2012 | Harada et al. | |
| 8,497,028 B1 | 7/2013 | Tryon et al. | |
| 8,696,979 B2 | 4/2014 | Yokokawa et al. | |
| 8,771,440 B2 | 7/2014 | Sato et al. | |
| 8,920,937 B2 | 12/2014 | Litton et al. | |
| 8,926,897 B2 | 1/2015 | Harada et al. | |
| 2002/0062886 A1 | 5/2002 | Hino et al. | |
| 2002/0182100 A1 | 12/2002 | Glatzel et al. | |
| 2003/0044634 A1 | 3/2003 | Kelly et al. | |
| 2003/0075247 A1 | 4/2003 | Koizumi et al. | |
| 2004/0005238 A1 | 1/2004 | Arrell et al. | |
| 2004/0096690 A1 | 5/2004 | Kelly et al. | |
| 2004/0109786 A1 | 6/2004 | O'Hara et al. | |
| 2005/0051242 A1 | 3/2005 | Koizumi et al. | |
| 2006/0011271 A1 | 1/2006 | Kobayashi et al. | |
| 2006/0093851 A1 | 5/2006 | Darolia et al. | |
| 2008/0240926 A1 | 10/2008 | Kobayashi et al. | |
| 2009/0075115 A1 | 3/2009 | Tryon et al. | |
| 2009/0220684 A1 | 9/2009 | Gorman et al. | |
| 2009/0258165 A1 | 10/2009 | Tryon et al. | |
| 2009/0274928 A1 | 11/2009 | Harada et al. | |
| 2009/0317288 A1 | 12/2009 | Yokokawa et al. | |
| 2010/0009092 A1 | 1/2010 | Tryon et al. | |
| 2011/0142714 A1 | 6/2011 | Harada et al. | |
| 2011/0171057 A1 | 7/2011 | Kobayashi et al. | |
| 2011/0256421 A1 | 10/2011 | Bose et al. | |
| 2013/0164558 A1 | 6/2013 | Zimmerman et al. | |
| 2013/0202913 A1* | 8/2013 | Kawagishi | C23C 28/30 |
| | | | 428/633 |

FOREIGN PATENT DOCUMENTS

| | | |
|---|---|---|
| EP | 1184473 A2 | 3/2002 |
| EP | 1498503 A1 | 1/2005 |
| EP | 1876263 A1 | 1/2008 |
| EP | 2110449 A1 | 10/2009 |
| EP | 2333121 A1 | 6/2011 |

(56) References Cited

FOREIGN PATENT DOCUMENTS

| EP | 2377683 A1 | 10/2011 |
|---|---|---|
| WO | 2012/053517 A1 | 4/2012 |

OTHER PUBLICATIONS

O. Lavigne et al., Relationships Between Microstructural Instabilities and Mechanical Behaviour in New Generation Nickel-Based Single Crystal Superalloys, Superalloys 2004, Sep. 2004, pp. 667-675, TMS (The Minerals, Metals & Materials Society), Warrendale, Pennsylvania.
S. Walston et al., Joint Development of a Fourth Generation Single Crystal Superalloy, Superalloys 2004, Sep. 2004, pp. 15-24, TMS (The Minerals, Metals & Materials Society), Warrendale, Pennsylvania.
Table-Compositions of Typical Cast Superalloys, Jul. 31, 2007, TMS (The Minerals, Metals & Materials Society), Warrendale, Pennsylvania.
W.S. Walston et al., A New Type of Microstructural Instability in Superalloys-SRZ, Superalloys 1996, Sep. 18, 1996, pp. 9-18, TMS (The Minerals, Metals & Materials Society), Warrendale, Pennsylvania.
Yutaka Koizumi et al., Development of Next-Generation Ni-Base Single Crystal Superalloys, Superalloys 2004, 2004, Sep. 2004, pp. 35-43, TMS (The Minerals, Metals & Materials Society), Warrendale, Pennsylvania.
European Search Report for European Patent Application No. 13180984.0, dated Dec. 3, 2013.
Enabling Propulsion Materials Program, Quarterly Technical Progress Report, High Speed Civil Transport NASA • Ge • P&W Enabling Propulsion Materials, Period of Performance: Jan. 1-Mar. 31, 1994, Apr. 25, 1994, Pratt & Whitney and GE Aircraft Engines, pp. 24-51, NASA—Lewis Research Center, Cleveland, Ohio.
Enabling Propulsion Materials Program, Annual Technical Progress Report, High Speed Civil Transport NASA • GE • P&W Enabling Propulsion Materials, Period of Performance: Jan. 1, 1994-May 1, 1995, Jun. 25, 1995, Pratt & Whitney and GE Aircraft Engines, pp. 4-46, NASA—Lewis Research Center, Cleveland, Ohio.
Enabling Propulsion Materials Program, Annual Technical Progress Report, High Speed Civil Transport NASA • GEAE • P&W Enabling Propulsion Materials, Period of Performance: Oct. 1, 1996-Sep. 30, 1997, Jan. 31, 1998, Pratt & Whitney and GE Aircraft Engines, pp. 2-32, National Aeronautics and Space Administration, Cleveland, Ohio.
Enabling Propulsion Materials Program, Annual Technical Progress Report, High Speed Civil Transport NASA • GE• P&W, Period of Performance: Oct. 1, 1997-Sep. 30, 1998, Nov. 30, 1998, Pratt & Whitney and GE Aircraft Engines, pp. 3-41, NASA—Lewis Research Center, Cleveland, Ohio.
U.S. Office action dated Jul. 12, 2017 for U.S. Appl. No. 13/969,689.
U.S. Office action dated May 1, 2018 for U.S. Appl. No. 13/969,689.
Canadian Office Action dated Sep. 28, 2020 for Canadian Patent Application No. 2,824,547.
Canadian Office Action dated Apr. 6, 2021 for Canadian Patent Application No. 2,824,547.
Kawagishi et al., "Development of an Oxidation-Resistant High-Strength Sixth-Generation Single-Crystal Superalloy TMS-238", Superalloys 2012: 12th International Symposium on Superalloys, Oct. 2012, pp. 189-195, The Minerals, Metals & Materials Society (TMS), McCandless, Pennsylvania.
Sunguk Wee et al., "Review on Mechanical Thermal Properties of Superalloys and Thermal Barrier Coating Used in Gas Turbines", Aug. 2020, Applied Sciences, Detroit, Michigan.
Kazuhide Matsumoto et al., "Development of Thermal Barrier Coating System Using EQ Coating for Advanced Single Crystal Superalloys", Superalloys 2016: Proceedings of the 13th International Symposium on Superalloys, Jul. 2016, pp. 279-284, The Minerals, Metals & Materials Society (TMS), McCandless, Pennsylvania.
"Nickel Base Single Crystal Superalloy TMS-196", Jul. 2008, High Temperature Materials Center, National Institute for Materials Science,Tsukuba, Ibaraki, Japan.
"Fifth Generation Nickel Base Single Crystal Superalloy TMS-196", Jul. 2006, High Temperature Materials Center, National Institute for Materials Science,Tsukuba, Ibaraki, Japan.
Canadian Office Action dated Oct. 25, 2021 for Canadian Patent Application No. 2,824,547.

* cited by examiner

FIG. 2
Table I
(Nominal Alloy Compositions)

| Alloy | Nominal Composition (wt%) | | | | | | | | |
|---|---|---|---|---|---|---|---|---|---|
| | Cr | Mo | W | Ta | Al | Co | Re | Ru |
| CPW-V1 | 5 | 1.5 | 5 | 4 | 6 | 12.5 | 5 | 2 |
| CPW-V2 | 5 | 1.5 | 5 | 6 | 6 | 6 | 5 | 2 |
| CPW-V3 | 5 | 1.5 | 5 | 7 | 6 | 12.5 | 5 | 2 |
| CPW-V4 | 2.1 | 2.7 | 9 | 2.3 | 6.2 | 7 | 4.5 | 7 |
| CPW-V5 | 2.3 | 3.2 | 9.8 | 3.3 | 6.2 | 5.6 | 3 | 7 |
| CPW-V6 | 3 | 2.2 | 8.5 | 3.5 | 6.1 | 4.8 | 3.5 | 5 |
| CPW-V7 | 2.6 | 2.3 | 8.5 | 3 | 5.7 | 8.4 | 4.2 | 5 |
| CPW-V8 | 2.8 | 2.1 | 7 | 4.2 | 6 | 2 | 4.5 | 5.5 |
| CPW-V9 | 3.7 | 1 | 7 | 4 | 6 | 2 | 5 | 4 |
| CPW-V10 | 2.1 | 2.7 | 4 | 4 | 6.2 | 2 | 4.5 | 7 |
| CPW-V11 | 5 | 1.5 | 5 | 7 | 5.8 | 12.5 | 5.5 | 3 |

FIG. 3
Table II
(Nominal Coating Compositions)

| Coating | Nominal composition (wt%) | | | | | | | | |
|---|---|---|---|---|---|---|---|---|---|
| | Al | Cr | Co | Ta | W | Mo | Hf | Si | Y | Zr |
| CPW-C1 | 7.5 | 4 | 10 | 6 | 5 | 0 | 0.4 | 0.2 | 0.5 | 0 |
| CPW-C2 | 11 | 4 | 16 | 4 | 2.5 | 0 | 0.4 | 0.2 | 0.5 | 0 |
| CPW-C3 | 6 | 24 | 3 | 3 | 6 | 0 | 0.5 | 0.2 | 0.1 | 0 |
| CPW-C4 | 6 | 13.5 | 12 | 3.5 | 3 | 0 | 0.5 | 0.2 | 0 | 0 |
| CPW-C5 | 10 | 10 | 12 | 0 | 0 | 0 | 0.4 | 0.2 | 0.5 | 0 |
| CPW-C6 | 11 | 5 | 10 | 6 | 5 | 1.7 | 0.4 | 0.2 | 0.5 | 0 |

FIG. 4
Table III
(Actual Alloy Compositions)

| Alloy | Actual Composition (wt%) | | | | | | | | | | | Density (lbs/in³) |
|---|---|---|---|---|---|---|---|---|---|---|---|---|
| | Cr | Mo | W | Ta | Al | Co | Re | Ru | Hf | C | S (ppm) | |
| CPW-V1 | 5.37 | 1.52 | 4.59 | 4.02 | 6 | 12.2 | 5.06 | 1.68 | 0 | n/m* | n/m | 0.315 |
| CPW-V2 | 4.95 | 1.61 | 5.43 | 5.49 | 5.74 | 6.17 | 5.4 | 2.23 | 0 | n/m | n/m | 0.320 |
| CPW-V3 | 4.65 | 1.51 | 5.41 | 6.7 | 5.81 | 12.2 | 5.5 | 2.13 | 0 | n/m | n/m | 0.322 |
| CPW-V4 | 2.15 | 2.73 | 8.83 | 2.36 | 6.2 | 7.05 | 4.24 | 6.85 | n/m | 0.016 | 1.1 | 0.325 |
| CPW-V5 | 2.31 | 3.14 | 9.64 | 3.45 | 6.11 | 5.69 | 2.97 | 6.85 | n/m | 0.024 | 0.43 | 0.326 |
| CPW-V6 | 2.91 | 2.24 | 8.37 | 3.52 | 6.08 | 4.52 | 3.34 | 4.73 | 0.18 | 0.019 | 1.2 | 0.321 |
| CPW-V7 | 2.61 | 2.29 | 8.42 | 3 | 5.69 | 8.34 | 4.06 | 4.89 | n/m | 0.02 | 1.2 | 0.324 |
| CPW-V8 | 2.76 | 2.12 | 6.96 | 4.96 | 5.85 | 2 | 4.4 | 5.41 | n/m | 0.018 | 0.77 | 0.324 |
| CPW-V9 | 3.71 | 1.02 | 6.9 | 4.2 | 5.97 | 1.98 | 4.78 | 3.92 | n/m | 0.024 | 0.84 | 0.320 |
| CPW-V10 | 2.15 | 2.74 | 4.05 | 4.03 | 6.33 | 2.02 | 4.5 | 7.06 | n/m | 0.022 | 2.1 | 0.319 |
| CPW-V11 | 4.99 | 1.53 | 5.15 | 6.6 | 5.6 | 12.52 | 5.57 | 2.95 | 0.15 | 0.0205 | 0.61 | 0.323 |

*Not measured

FIG. 5
Table IV
(Actual Coating Compositions)

| Coating | Actual composition (wt%) | | | | | | | | | |
|---|---|---|---|---|---|---|---|---|---|---|
| | Al | Cr | Co | Ta | W | Mo | Hf | Si | Y | Zr |
| CPW-C1 | 7.0 | 4.7 | 13.0 | 5.6 | 4.8 | 0.0 | 0.5 | 0.3 | 0.5 | 0.0 |
| CPW-C2 | 9.2 | 4.5 | 13.2 | 4.1 | 2.7 | 0.0 | 0.5 | 0.3 | 0.5 | 0.0 |
| CPW-C3 | 6.0 | 23.8 | 3.3 | 3.1 | 6.0 | 0.0 | 0.46 | 0.29 | 0.19 | 0.0 |
| CPW-C4 | 5.9 | 13.2 | 13.2 | 3.5 | 3.0 | 0.0 | 0.4 | 0.3 | 0.0 | 0.25 |
| CPW-C5 | 8.2 | 10.6 | 13.0 | 0.0 | 0.0 | 0.0 | 0.48 | 0.23 | 0.47 | 0.14 |
| CPW-C6 | 9.2 | 5.6 | 13.1 | 5.7 | 5.4 | 2.0 | 0.48 | 0.30 | 0.5 | 0.29 |

FIG. 6A

Table V (Predicted and Actual SRZ Presence)

| Alloy | Coating | Predicted SRZ Score, Nominal | Predicted SRZ Score, Actual | Actual SRZ Presence |
|---|---|---|---|---|
| CPW-V1 | CPW-C5 | 1.14 | - | No |
| CPW-V2 | CPW-C5 | 1.11 | - | No |
| CPW-V3 | CPW-C5 | 1.36 | - | No |
| CPW-V4 | CPW-C5 | 1.25 | 1.12 | No |
| CPW-V4 | CPW-C6 | 1.23 | 1.12 | Borderline |
| CPW-V4 | CPW-C1 | 1.02 | 1.01 | No |
| CPW-V4 | CPW-C2 | 1.08 | 1.03 | No |
| CPW-V4 | CPW-C3 | 2.11 | 1.98 | Yes |
| CPW-V4 | CPW-C4 | 1.15 | 1.10 | No |
| CPW-V5 | CPW-C5 | 1.06 | 1.05 | No |
| CPW-V5 | CPW-C6 | 1.06 | 1.06 | Borderline |
| CPW-V5 | CPW-C1 | 1.00 | 1.01 | No |
| CPW-V5 | CPW-C2 | 1.02 | 1.01 | No |
| CPW-V5 | CPW-C3 | 1.47 | 1.57 | Yes |
| CPW-V5 | CPW-C4 | 1.04 | 1.04 | No |
| CPW-V6 | CPW-C5 | 1.05 | 1.03 | No |
| CPW-V6 | CPW-C6 | 1.07 | 1.06 | No |
| CPW-V6 | CPW-C1 | 1.01 | 1.01 | No |
| CPW-V6 | CPW-C2 | 1.02 | 1.01 | No |
| CPW-V6 | CPW-C3 | 1.29 | 1.28 | Yes |
| CPW-V6 | CPW-C4 | 1.03 | 1.03 | No |

FIG. 6B
Table V (Continued)
(Predicted and Actual SRZ Presence)

| Alloy | Coating | Predicted SRZ Score, Nominal | Predicted SRZ Score, Actual | Actual SRZ Presence |
|---|---|---|---|---|
| CPW-V7 | CPW-C5 | 1.14 | 1.08 | No |
| CPW-V7 | CPW-C6 | 1.13 | 1.08 | No |
| CPW-V7 | CPW-C1 | 1.01 | 1.01 | No |
| CPW-V7 | CPW-C2 | 1.04 | 1.02 | No |
| CPW-V7 | CPW-C3 | 1.97 | 1.86 | No |
| CPW-V7 | CPW-C4 | 1.10 | 1.07 | No |
| CPW-V8 | CPW-C5 | 1.10 | 1.06 | No |
| CPW-V8 | CPW-C6 | 1.17 | 1.12 | Borderline |
| CPW-V8 | CPW-C1 | 1.02 | 1.01 | No |
| CPW-V8 | CPW-C2 | 1.05 | 1.03 | No |
| CPW-V8 | CPW-C3 | 1.25 | 1.24 | Yes |
| CPW-V8 | CPW-C4 | 1.05 | 1.04 | No |
| CPW-V9 | CPW-C5 | 1.06 | 1.03 | No |
| CPW-V9 | CPW-C6 | 1.14 | 1.10 | Borderline |
| CPW-V9 | CPW-C1 | 1.01 | 1.01 | No |
| CPW-V9 | CPW-C2 | 1.03 | 1.02 | Borderline |
| CPW-V9 | CPW-C3 | 1.12 | 1.11 | Yes |
| CPW-V9 | CPW-C4 | 1.03 | 1.03 | No |
| CPW-V10 | CPW-C5 | 1.17 | 1.10 | No |
| CPW-V10 | CPW-C6 | 1.23 | 1.15 | Borderline |
| CPW-V10 | CPW-C1 | 1.02 | 1.02 | No |
| CPW-V10 | CPW-C2 | 1.09 | 1.05 | No |
| CPW-V10 | CPW-C3 | 1.43 | 1.42 | Yes |
| CPW-V10 | CPW-C4 | 1.07 | 1.06 | No |
| CPW-V11 | CPW-C5 | 1.33 | 1.32 | No |
| CPW-V11 | CPW-C6 | 1.39 | 1.45 | Borderline |
| CPW-V11 | CPW-C1 | 1.02 | 1.03 | No |
| CPW-V11 | CPW-C2 | 1.07 | 1.07 | No |
| CPW-V11 | CPW-C3 | 2.62 | 2.71 | Yes |
| CPW-V11 | CPW-C4 | 1.28 | 1.33 | No |

CPW-V6 and CPW-C5

CPW-V10 and CPW-C1

CPW-V4 and CPW-C2

CPW-V8 and CPW-C4

CPW-V4 and CPW-C5

CPW-V8 and CPW-C6

FIG. 13A

Table VI

Alloy Compositions (Weight Percent)

| Alloy | Element | Broad range | | Narrow range | |
|---|---|---|---|---|---|
| | | Min. | Max. | Min. | Max. |
| CPW-V1 | Cr | 4.0 | 6.0 | 5.1 | 5.6 |
| | Mo | 1.0 | 2.0 | 1.4 | 1.7 |
| | W | 4.0 | 5.0 | 4.4 | 4.8 |
| | Ta | 3.0 | 5.0 | 3.9 | 4.1 |
| | Al | 5.0 | 7.0 | 5.8 | 6.2 |
| | Co | 11.0 | 13.0 | 11.6 | 12.8 |
| | Re | 4.0 | 6.0 | 4.9 | 5.2 |
| | Ru | 1.0 | 2.0 | 1.6 | 1.8 |
| | Hf | 0.05 | 0.5 | 0.1 | 0.2 |
| | Si | 0.0 | 0.0 | 0.0 | 0.0 |
| | Y | 0.0 | 0.0 | 0.0 | 0.0 |
| | Zr | 0.0 | 0.0 | 0.0 | 0.0 |
| CPW-V2 | Cr | 4.0 | 6.0 | 4.7 | 5.2 |
| | Mo | 1.0 | 2.0 | 1.4 | 1.8 |
| | W | 5.0 | 6.0 | 5.2 | 5.7 |
| | Ta | 5.0 | 6.0 | 5.6 | 5.9 |
| | Al | 5.0 | 6.0 | 5.6 | 5.9 |
| | Co | 5.0 | 7.0 | 5.9 | 6.5 |
| | Re | 5.0 | 6.0 | 5.2 | 5.6 |
| | Ru | 2.0 | 3.0 | 2.1 | 2.4 |
| | Hf | 0.05 | 0.5 | 0.1 | 0.2 |
| | Si | 0.0 | 0.0 | 0.0 | 0.0 |
| | Y | 0.0 | 0.0 | 0.0 | 0.0 |
| | Zr | 0.0 | 0.0 | 0.0 | 0.0 |
| CPW-V3 | Cr | 4.0 | 6.0 | 4.4 | 4.9 |
| | Mo | 1.0 | 2.0 | 1.3 | 1.7 |
| | W | 5.0 | 6.0 | 5.1 | 5.7 |
| | Ta | 6.0 | 7.0 | 6.5 | 6.9 |
| | Al | 5.0 | 6.0 | 5.7 | 6.0 |
| | Co | 11.0 | 13.0 | 11.6 | 12.8 |
| | Re | 5.0 | 6.0 | 5.3 | 5.7 |
| | Ru | 1.0 | 3.0 | 2.0 | 2.3 |
| | Hf | 0.05 | 0.5 | 0.1 | 0.2 |
| | Si | 0.0 | 0.0 | 0.0 | 0.0 |
| | Y | 0.0 | 0.0 | 0.0 | 0.0 |
| | Zr | 0.0 | 0.0 | 0.0 | 0.0 |

FIG. 13B
Table VI (Continued)
Alloy Compositions (Weight Percent)

| Alloy | Element | Broad range | | Narrow range | |
|---|---|---|---|---|---|
| | | Min. | Max. | Min. | Max. |
| CPW-V4 | Cr | 2.0 | 3.0 | 2.0 | 2.3 |
| | Mo | 2.0 | 4.0 | 2.4 | 3.0 |
| | W | 8.0 | 10.0 | 8.4 | 9.3 |
| | Ta | 2.0 | 3.0 | 2.3 | 2.4 |
| | Al | 6.0 | 7.0 | 6.0 | 6.4 |
| | Co | 6.0 | 8.0 | 6.7 | 7.4 |
| | Re | 4.0 | 5.0 | 4.1 | 4.4 |
| | Ru | 6.0 | 8.0 | 6.4 | 7.3 |
| | Hf | 0.05 | 0.5 | 0.1 | 0.2 |
| | Si | 0.0 | 0.0 | 0.0 | 0.0 |
| | Y | 0.0 | 0.0 | 0.0 | 0.0 |
| | Zr | 0.0 | 0.0 | 0.0 | 0.0 |
| CPW-V5 | Cr | 2.0 | 3.0 | 2.2 | 2.4 |
| | Mo | 2.0 | 4.0 | 2.8 | 3.5 |
| | W | 9.0 | 11.0 | 9.1 | 10.1 |
| | Ta | 3.0 | 4.0 | 3.3 | 3.6 |
| | Al | 5.0 | 7.0 | 5.9 | 6.3 |
| | Co | 5.0 | 6.0 | 5.4 | 6.0 |
| | Re | 2.0 | 4.0 | 2.9 | 3.1 |
| | Ru | 6.0 | 8.0 | 6.4 | 7.3 |
| | Hf | 0.05 | 0.5 | 0.1 | 0.2 |
| | Si | 0.0 | 0.0 | 0.0 | 0.0 |
| | Y | 0.0 | 0.0 | 0.0 | 0.0 |
| | Zr | 0.0 | 0.0 | 0.0 | 0.0 |
| CPW-V6 | Cr | 2.0 | 4.0 | 2.8 | 3.1 |
| | Mo | 1.0 | 3.0 | 2.0 | 2.5 |
| | W | 7.0 | 9.0 | 7.9 | 8.8 |
| | Ta | 3.0 | 4.0 | 3.4 | 3.6 |
| | Al | 5.0 | 7.0 | 5.9 | 6.2 |
| | Co | 4.0 | 5.0 | 4.3 | 4.7 |
| | Re | 3.0 | 4.0 | 3.2 | 3.5 |
| | Ru | 4.0 | 6.0 | 4.4 | 5.0 |
| | Hf | 0.05 | 0.5 | 0.1 | 0.2 |
| | Si | 0.0 | 0.0 | 0.0 | 0.0 |
| | Y | 0.0 | 0.0 | 0.0 | 0.0 |
| | Zr | 0.0 | 0.0 | 0.0 | 0.0 |

FIG. 13C
Table VI (Continued)
Alloy Compositions (Weight Percent)

| Alloy | Element | Broad range | | Narrow range | |
|---|---|---|---|---|---|
| | | Min. | Max. | Min. | Max. |
| CPW-V7 | Cr | 2.0 | 3.0 | 2.5 | 2.7 |
| | Mo | 2.0 | 3.0 | 2.0 | 2.5 |
| | W | 7.0 | 9.0 | 8.0 | 8.8 |
| | Ta | 2.0 | 4.0 | 2.9 | 3.1 |
| | Al | 5.0 | 6.0 | 5.5 | 5.8 |
| | Co | 7.0 | 9.0 | 7.9 | 8.8 |
| | Re | 3.0 | 5.0 | 3.9 | 4.2 |
| | Ru | 4.0 | 6.0 | 4.6 | 5.2 |
| | Hf | 0.05 | 0.5 | 0.1 | 0.2 |
| | Si | 0.0 | 0.0 | 0.0 | 0.0 |
| | Y | 0.0 | 0.0 | 0.0 | 0.0 |
| | Zr | 0.0 | 0.0 | 0.0 | 0.0 |
| CPW-V8 | Cr | 2.0 | 3.0 | 2.6 | 2.9 |
| | Mo | 1.0 | 3.0 | 1.9 | 2.4 |
| | W | 6.0 | 8.0 | 6.6 | 7.3 |
| | Ta | 4.0 | 6.0 | 4.8 | 5.1 |
| | Al | 5.0 | 7.0 | 5.7 | 6.0 |
| | Co | 1.0 | 3.0 | 1.9 | 2.1 |
| | Re | 4.0 | 5.0 | 4.3 | 4.5 |
| | Ru | 5.0 | 6.0 | 5.0 | 5.8 |
| | Hf | 0.05 | 0.5 | 0.1 | 0.2 |
| | Si | 0.0 | 0.0 | 0.0 | 0.0 |
| | Y | 0.0 | 0.0 | 0.0 | 0.0 |
| | Zr | 0.0 | 0.0 | 0.0 | 0.0 |
| CPW-V9 | Cr | 3.0 | 4.0 | 3.5 | 3.9 |
| | Mo | 0.5 | 2.0 | 0.9 | 1.1 |
| | W | 6.0 | 8.0 | 6.5 | 7.3 |
| | Ta | 4.0 | 5.0 | 4.1 | 4.3 |
| | Al | 5.0 | 7.0 | 5.8 | 6.1 |
| | Co | 1.0 | 3.0 | 1.9 | 2.1 |
| | Re | 4.0 | 5.0 | 4.6 | 4.9 |
| | Ru | 3.0 | 5.0 | 3.7 | 4.2 |
| | Hf | 0.05 | 0.5 | 0.1 | 0.2 |
| | Si | 0.0 | 0.0 | 0.0 | 0.0 |
| | Y | 0.0 | 0.0 | 0.0 | 0.0 |
| | Zr | 0.0 | 0.0 | 0.0 | 0.0 |

FIG. 13D
Table VI (Continued)
Alloy Compositions (Weight Percent)

| Alloy | Element | Broad range | | Narrow range | |
|---|---|---|---|---|---|
| | | Min. | Max. | Min. | Max. |
| CPW-V10 | Cr | 2.0 | 3.0 | 2.0 | 2.3 |
| | Mo | 2.0 | 4.0 | 2.4 | 3.0 |
| | W | 3.0 | 5.0 | 3.8 | 4.3 |
| | Ta | 3.0 | 5.0 | 3.9 | 4.2 |
| | Al | 6.0 | 7.0 | 6.2 | 6.5 |
| | Co | 1.0 | 3.0 | 1.9 | 2.1 |
| | Re | 4.0 | 5.0 | 4.4 | 4.7 |
| | Ru | 6.0 | 8.0 | 6.6 | 7.5 |
| | Hf | 0.05 | 0.5 | 0.1 | 0.2 |
| | Si | 0.0 | 0.0 | 0.0 | 0.0 |
| | Y | 0.0 | 0.0 | 0.0 | 0.0 |
| | Zr | 0.0 | 0.0 | 0.0 | 0.0 |
| CPW-V11 | Cr | 4.0 | 6.0 | 4.7 | 5.2 |
| | Mo | 1.0 | 2.0 | 1.4 | 1.7 |
| | W | 4.0 | 6.0 | 4.9 | 5.4 |
| | Ta | 6.0 | 7.0 | 6.4 | 6.8 |
| | Al | 5.0 | 6.0 | 5.5 | 5.7 |
| | Co | 11.0 | 14.0 | 11.9 | 13.1 |
| | Re | 5.0 | 6.0 | 5.4 | 5.8 |
| | Ru | 2.0 | 4.0 | 2.8 | 3.1 |
| | Hf | 0.05 | 0.5 | 0.1 | 0.2 |
| | Si | 0.0 | 0.0 | 0.0 | 0.0 |
| | Y | 0.0 | 0.0 | 0.0 | 0.0 |
| | Zr | 0.0 | 0.0 | 0.0 | 0.0 |

FIG. 14A

Table VII
Coating Compositions (Weight Percent)

| Coating | Element | Broad range | | Narrow range | |
|---|---|---|---|---|---|
| | | Min. | Max. | Min. | Max. |
| CPW-C1 | Cr | 3 | 6 | 4.1 | 5.3 |
| | Mo | 0 | 0 | 0.0 | 0.0 |
| | W | 4 | 6 | 4.3 | 5.3 |
| | Ta | 5 | 7 | 5.0 | 6.2 |
| | Al | 6 | 8 | 6.3 | 7.7 |
| | Co | 9 | 15 | 11.8 | 14.2 |
| | Re | 0 | 0 | 0.0 | 0.0 |
| | Ru | 0 | 0 | 0.0 | 0.0 |
| | Hf | 0.05 | 0.70 | 0.1 | 0.5 |
| | Si | 0.1 | 0.5 | 0.2 | 0.4 |
| | Y | 0.1 | 0.7 | 0.3 | 0.7 |
| | Zr | 0 | 0 | 0.0 | 0.0 |
| CPW-C2 | Cr | 3.0 | 6.0 | 3.9 | 5.1 |
| | Mo | 0.0 | 0.0 | 0.0 | 0.0 |
| | W | 2.0 | 3.0 | 2.4 | 3.0 |
| | Ta | 3.0 | 5.0 | 3.7 | 4.5 |
| | Al | 8.0 | 11.0 | 8.3 | 10.1 |
| | Co | 11.0 | 17.0 | 12.0 | 14.4 |
| | Re | 0.0 | 0.0 | 0.0 | 0.0 |
| | Ru | 0.0 | 0.0 | 0.0 | 0.0 |
| | Hf | 0.05 | 0.7 | 0.1 | 0.5 |
| | Si | 0.1 | 0.5 | 0.2 | 0.4 |
| | Y | 0.1 | 0.7 | 0.3 | 0.7 |
| | Zr | 0.0 | 0.0 | 0.0 | 0.0 |
| CPW-C3 | Cr | 22.0 | 26.0 | 22.1 | 25.5 |
| | Mo | 0.0 | 0.0 | 0.0 | 0.0 |
| | W | 5.0 | 7.0 | 5.4 | 6.6 |
| | Ta | 2.0 | 4.0 | 2.8 | 3.4 |
| | Al | 5.0 | 7.0 | 5.4 | 6.6 |
| | Co | 2.0 | 4.0 | 3.0 | 3.6 |
| | Re | 0.0 | 0.0 | 0.0 | 0.0 |
| | Ru | 0.0 | 0.0 | 0.0 | 0.0 |
| | Hf | 0.05 | 0.7 | 0.1 | 0.5 |
| | Si | 0.1 | 0.5 | 0.2 | 0.4 |
| | Y | 0.1 | 0.5 | 0.1 | 0.5 |
| | Zr | 0.0 | 0.0 | 0.0 | 0.0 |

FIG. 14B
Table VII (Continued)
Coating Compositions (Weight Percent)

| Coating | Element | Broad range | | Narrow range | |
|---|---|---|---|---|---|
| | | Min. | Max. | Min. | Max. |
| CPW-C4 | Cr | 11.0 | 15.0 | 11.6 | 14.9 |
| | Mo | 0.0 | 0.0 | 0.0 | 0.0 |
| | W | 2.0 | 4.0 | 2.7 | 3.3 |
| | Ta | 3.0 | 4.0 | 3.1 | 3.9 |
| | Al | 5.0 | 7.0 | 5.3 | 6.5 |
| | Co | 11.0 | 15.0 | 12.0 | 14.4 |
| | Re | 0.0 | 0.0 | 0.0 | 0.0 |
| | Ru | 0.0 | 0.0 | 0.0 | 0.0 |
| | Hf | 0.05 | 0.7 | 0.1 | 0.5 |
| | Si | 0.1 | 0.5 | 0.2 | 0.4 |
| | Y | 0.00 | 0.0 | 0.0 | 0.0 |
| | Zr | 0.05 | 0.7 | 0.1 | 0.5 |
| CPW-C5 | Cr | 9.0 | 12.0 | 9.3 | 11.9 |
| | Mo | 0.0 | 0.0 | 0.0 | 0.0 |
| | W | 0.0 | 0.0 | 0.0 | 0.0 |
| | Ta | 0.0 | 0.0 | 0.0 | 0.0 |
| | Al | 7.0 | 10.0 | 7.4 | 9.0 |
| | Co | 11.0 | 15.0 | 11.8 | 14.2 |
| | Re | 0.0 | 0.0 | 0.0 | 0.0 |
| | Ru | 0.0 | 0.0 | 0.0 | 0.0 |
| | Hf | 0.05 | 0.7 | 0.1 | 0.5 |
| | Si | 0.1 | 0.5 | 0.1 | 0.3 |
| | Y | 0.1 | 0.7 | 0.3 | 0.6 |
| | Zr | 0.05 | 0.7 | 0.1 | 0.5 |
| CPW-C6 | Cr | 4.0 | 7.0 | 4.9 | 6.3 |
| | Mo | 1.0 | 3.0 | 1.8 | 2.2 |
| | W | 4.0 | 6.0 | 4.8 | 6.0 |
| | Ta | 5.0 | 7.0 | 5.1 | 6.3 |
| | Al | 8.0 | 11.0 | 8.3 | 10.1 |
| | Co | 9.0 | 15.0 | 11.9 | 14.3 |
| | Re | 0.0 | 0.0 | 0.0 | 0.0 |
| | Ru | 0.0 | 0.0 | 0.0 | 0.0 |
| | Hf | 0.05 | 0.7 | 0.1 | 0.5 |
| | Si | 0.1 | 0.5 | 0.2 | 0.4 |
| | Y | 0.1 | 0.7 | 0.3 | 0.7 |
| | Zr | 0.05 | 0.7 | 0.1 | 0.5 |

FIG. 15A
Table VIII

| Alloy | Element | Substrate Range (wt%) | | | | Coating Range (wt%) | | | | | |
|---|---|---|---|---|---|---|---|---|---|---|---|
| | | Broad Range | | Narrow Range | | SRZ Broad Range | | SRZ + Oxidation Broad Range | | SRZ + Oxidation Narrow Range | |
| | | Min | Max | Min | Max | Min | Max | Min. | Max. | Min | Max |
| CPW-V1 CPW-V3 | Cr | 4.0 | 6.0 | 4.4 | 5.6 | 0 | 13 | 3 | 13 | 4 | 9 |
| | Mo | 1.0 | 2.0 | 1.3 | 1.7 | 0 | 4 | 0 | 3 | 0 | 2 |
| | W | 4.0 | 6.0 | 4.4 | 5.7 | 0 | 7 | 0 | 6 | 0 | 6 |
| | Ta | 3.0 | 7.0 | 3.9 | 6.9 | 0 | 7 | 0 | 7 | 0 | 6.3 |
| | Al | 5.0 | 7.0 | 5.7 | 6.2 | 5 | 13 | 5 | 11 | 6 | 10 |
| | Co | 11.0 | 13.0 | 11.6 | 12.8 | 2 | 16 | 9 | 16 | 12 | 14 |
| | Re | 4.0 | 6.0 | 4.9 | 5.7 | 0 | 0 | 0 | 0 | 0 | 0 |
| | Ru | 1.0 | 3.0 | 1.6 | 2.3 | 0 | 0 | 0 | 0 | 0 | 0 |
| | Hf | 0.1 | 0.5 | 0.1 | 0.2 | 0.05 | 0.7 | 0.05 | 0.7 | 0.1 | 0.5 |
| | Si | 0.0 | 0.0 | 0.0 | 0.0 | 0.1 | 0.5 | 0.1 | 0.5 | 0.1 | 0.4 |
| | Y | 0.0 | 0.0 | 0.0 | 0.0 | 0 | 0.7 | 0 | 0.7 | 0 | 0.5 |
| | Zr | 0.0 | 0.0 | 0.0 | 0.0 | 0 | 0.7 | 0 | 0.7 | 0 | 0.5 |
| CPW-V2 | Cr | 4.0 | 6.0 | 4.7 | 5.2 | 5 | 18 | 3 | 15 | 4 | 15 |
| | Mo | 1.0 | 2.0 | 1.4 | 1.8 | 0 | 4 | 0 | 3 | 0 | 2.2 |
| | W | 5.0 | 6.0 | 5.2 | 5.7 | 0 | 7 | 0 | 6 | 0 | 6 |
| | Ta | 5.0 | 6.0 | 5.6 | 5.9 | 0 | 7 | 0 | 7 | 0 | 6.3 |
| | Al | 5.0 | 6.0 | 5.6 | 5.9 | 5 | 13 | 5 | 11 | 6 | 10 |
| | Co | 5.0 | 7.0 | 5.9 | 6.5 | 2 | 16 | 9 | 16 | 12 | 14 |
| | Re | 5.0 | 6.0 | 5.2 | 5.6 | 0 | 0 | 0 | 0 | 0 | 0 |
| | Ru | 2.0 | 3.0 | 2.1 | 2.4 | 0 | 0 | 0 | 0 | 0 | 0 |
| | Hf | 0.1 | 0.5 | 0.1 | 0.2 | 0.05 | 0.7 | 0.05 | 0.7 | 0.1 | 0.5 |
| | Si | 0.0 | 0.0 | 0.0 | 0.0 | 0.1 | 0.5 | 0.1 | 0.5 | 0.1 | 0.4 |
| | Y | 0.0 | 0.0 | 0.0 | 0.0 | 0 | 0.7 | 0 | 0.7 | 0 | 0.5 |
| | Zr | 0.0 | 0.0 | 0.0 | 0.0 | 0 | 0.7 | 0 | 0.7 | 0 | 0.5 |

FIG. 15B
Table VIII (Continued)

| Alloy | Element | Substrate Range (wt%) | | | | Coating Range (wt%) | | | | | |
|---|---|---|---|---|---|---|---|---|---|---|---|
| | | Broad Range | | Narrow Range | | SRZ Broad Range | | SRZ + Oxidation Broad Range | | SRZ + Oxidation Narrow Range | |
| | | Min | Max | Min | Max | Min | Max | Min | Max. | Min | Max |
| CPW-V4 | Cr | 2.0 | 3.0 | 2.0 | 2.3 | 0 | 15 | 3 | 15 | 4 | 13 |
| | Mo | 2.0 | 4.0 | 2.4 | 3.0 | 0 | 3 | 0 | 3 | 0 | 2.2 |
| | W | 8.0 | 10.0 | 8.4 | 9.3 | 0 | 7 | 0 | 6 | 0 | 6 |
| | Ta | 2.0 | 3.0 | 2.3 | 2.4 | 0 | 7 | 0 | 7 | 0 | 6.3 |
| | Al | 6.0 | 7.0 | 6.0 | 6.4 | 5 | 13 | 5 | 11 | 6 | 10 |
| | Co | 6.0 | 8.0 | 6.7 | 7.4 | 2 | 17 | 9 | 17 | 12 | 14 |
| | Re | 4.0 | 5.0 | 4.1 | 4.4 | 0 | 0 | 0 | 0 | 0 | 0 |
| | Ru | 6.0 | 8.0 | 6.4 | 7.3 | 0 | 0 | 0 | 0 | 0 | 0 |
| | Hf | 0.1 | 0.5 | 0.1 | 0.2 | 0.05 | 0.7 | 0.05 | 0.7 | 0.1 | 0.5 |
| | Si | 0.0 | 0.0 | 0.0 | 0.0 | 0.1 | 0.5 | 0.1 | 0.5 | 0.1 | 0.4 |
| | Y | 0.0 | 0.0 | 0.0 | 0.0 | 0 | 0.7 | 0 | 0.7 | 0 | 0.5 |
| | Zr | 0.0 | 0.0 | 0.0 | 0.0 | 0 | 0.7 | 0 | 0.7 | 0 | 0.5 |
| CPW-V5 CPW-V6 CPW-V8 CPW-V10 | Cr | 2.0 | 3.0 | 2.0 | 2.3 | 0 | 18 | 3 | 15 | 4 | 15 |
| | Mo | 1.0 | 3.0 | 1.9 | 2.4 | 0 | 4 | 0 | 3 | 0 | 2.2 |
| | W | 3.0 | 5.0 | 3.8 | 4.3 | 0 | 7 | 0 | 6 | 0 | 6 |
| | Ta | 3.0 | 4.0 | 3.3 | 3.6 | 0 | 7 | 0 | 7 | 0 | 6.3 |
| | Al | 5.0 | 7.0 | 5.7 | 6.0 | 5 | 13 | 5 | 11 | 6 | 10 |
| | Co | 1.0 | 3.0 | 1.9 | 2.1 | 2 | 16 | 9 | 16 | 12 | 14 |
| | Re | 2.0 | 4.0 | 2.9 | 3.1 | 0 | 0 | 0 | 0 | 0 | 0.0 |
| | Ru | 4.0 | 6.0 | 4.4 | 5.0 | 0 | 0 | 0 | 0 | 0 | 0.0 |
| | Hf | 0.1 | 0.5 | 0.1 | 0.2 | 0.05 | 0.7 | 0.05 | 0.7 | 0.1 | 0.5 |
| | Si | 0.0 | 0.0 | 0.0 | 0.0 | 0.1 | 0.5 | 0.1 | 0.5 | 0.1 | 0.4 |
| | Y | 0.0 | 0.0 | 0.0 | 0.0 | 0 | 0.7 | 0 | 0.7 | 0 | 0.5 |
| | Zr | 0.0 | 0.0 | 0.0 | 0.0 | 0 | 0.7 | 0 | 0.7 | 0 | 0.5 |

FIG. 15C
Table VIII (Continued)

| Alloy | Element | Substrate Range (wt%) | | | | Coating Range (wt%) | | | | | |
|---|---|---|---|---|---|---|---|---|---|---|---|
| | | Broad Range | | Narrow Range | | SRZ Broad Range | | SRZ + Oxidation Broad Range | | SRZ + Oxidation Narrow Range | |
| | | Min | Max | Min | Max | Min | Max | Min. | Max. | Min | Max |
| CPW-V7 | Cr | 2.0 | 3.0 | 2.5 | 2.7 | 0 | 15 | 3 | 15 | 4 | 13 |
| | Mo | 2.0 | 3.0 | 2.0 | 2.5 | 0 | 4 | 0 | 3 | 0 | 2.2 |
| | W | 7.0 | 9.0 | 8.0 | 8.8 | 0 | 7 | 0 | 6 | 0 | 6 |
| | Ta | 2.0 | 4.0 | 2.9 | 3.1 | 0 | 7 | 0 | 7 | 0 | 6.3 |
| | Al | 5.0 | 6.0 | 5.5 | 5.8 | 5 | 13 | 5 | 11 | 6 | 10 |
| | Co | 7.0 | 9.0 | 7.9 | 8.8 | 2 | 17 | 9 | 17 | 12 | 14 |
| | Re | 3.0 | 5.0 | 3.9 | 4.2 | 0 | 0 | 0 | 0 | 0 | 0 |
| | Ru | 4.0 | 6.0 | 4.6 | 5.2 | 0 | 0 | 0 | 0 | 0 | 0 |
| | Hf | 0.1 | 0.5 | 0.1 | 0.2 | 0.05 | 0.7 | 0.05 | 0.7 | 0.1 | 0.5 |
| | Si | 0.0 | 0.0 | 0.0 | 0.0 | 0.1 | 0.5 | 0.1 | 0.5 | 0.1 | 0.4 |
| | Y | 0.0 | 0.0 | 0.0 | 0.0 | 0 | 0.7 | 0 | 0.7 | 0 | 0.5 |
| | Zr | 0.0 | 0.0 | 0.0 | 0.0 | 0 | 0.7 | 0 | 0.7 | 0 | 0.5 |
| CPW-V9 | Cr | 3.0 | 4.0 | 3.5 | 3.9 | 0 | 20 | 3 | 15 | 4 | 15 |
| | Mo | 0.5 | 2.0 | 0.9 | 1.1 | 0 | 4 | 0 | 3 | 0 | 2.2 |
| | W | 6.0 | 8.0 | 6.5 | 7.3 | 0 | 7 | 0 | 6 | 0 | 6 |
| | Ta | 4.0 | 5.0 | 4.1 | 4.3 | 0 | 7 | 0 | 7 | 0 | 6.3 |
| | Al | 5.0 | 7.0 | 5.8 | 6.1 | 5 | 13 | 5 | 11 | 6 | 10 |
| | Co | 1.0 | 3.0 | 1.9 | 2.1 | 2 | 17 | 9 | 17 | 12 | 14 |
| | Re | 4.0 | 5.0 | 4.6 | 4.9 | 0 | 0 | 0 | 0 | 0 | 0 |
| | Ru | 3.0 | 5.0 | 3.7 | 4.2 | 0 | 0 | 0 | 0 | 0 | 0 |
| | Hf | 0.1 | 0.5 | 0.1 | 0.2 | 0.05 | 0.7 | 0.05 | 0.7 | 0.1 | 0.5 |
| | Si | 0.0 | 0.0 | 0.0 | 0.0 | 0.1 | 0.5 | 0.1 | 0.5 | 0.1 | 0.4 |
| | Y | 0.0 | 0.0 | 0.0 | 0.0 | 0 | 0.7 | 0 | 0.7 | 0 | 0.5 |
| | Zr | 0.0 | 0.0 | 0.0 | 0.0 | 0 | 0.7 | 0 | 0.7 | 0 | 0.5 |

FIG. 15D
Table VIII (Continued)

| Alloy | Element | Substrate Range (wt%) | | | | Coating Range (wt%) | | | | | |
| --- | --- | --- | --- | --- | --- | --- | --- | --- | --- | --- | --- |
| | | Broad Range | | Narrow Range | | SRZ Broad Range | | SRZ + Oxidation Broad Range | | SRZ + Oxidation Narrow Range | |
| | | Min | Max | Min | Max | Min | Max | Min. | Max. | Min | Max |
| CPW-V11 | Cr | 4.0 | 6.0 | 4.7 | 5.2 | 0 | 9 | 3 | 9 | 4 | 7 |
| | Mo | 1.0 | 2.0 | 1.4 | 1.7 | 0 | 4 | 0 | 3 | 0 | 2.2 |
| | W | 4.0 | 6.0 | 4.9 | 5.4 | 0 | 7 | 0 | 6 | 0 | 4 |
| | Ta | 6.0 | 7.0 | 6.4 | 6.8 | 0 | 7 | 0 | 7 | 0 | 4 |
| | Al | 5.0 | 6.0 | 5.5 | 5.7 | 5 | 13 | 5 | 11 | 6 | 10 |
| | Co | 11.0 | 14.0 | 11.9 | 13.1 | 2 | 15 | 9 | 15 | 12 | 14 |
| | Re | 5.0 | 6.0 | 5.4 | 5.8 | 0 | 0 | 0 | 0 | 0 | 0 |
| | Ru | 2.0 | 4.0 | 2.8 | 3.1 | 0 | 0 | 0 | 0 | 0 | 0 |
| | Hf | 0.1 | 0.5 | 0.1 | 0.2 | 0.05 | 0.7 | 0.05 | 0.7 | 0.1 | 0.5 |
| | Si | 0.0 | 0.0 | 0.0 | 0.0 | 0.1 | 0.5 | 0.1 | 0.5 | 0.1 | 0.4 |
| | Y | 0.0 | 0.0 | 0.0 | 0.0 | 0 | 0.7 | 0 | 0.7 | 0 | 0.5 |
| | Zr | 0.0 | 0.0 | 0.0 | 0.0 | 0 | 0.7 | 0 | 0.7 | 0 | 0.5 |

OXIDATION-RESISTANT COATED SUPERALLOY

CROSS-REFERENCE TO RELATED APPLICATIONS

This is a divisional of U.S. patent application Ser. No. 16/177,974, filed Nov. 1, 2018, entitled "Oxidation-Resistant Coated Superalloy" which is a divisional of U.S. patent application Ser. No. 13/969,689, filed Aug. 19, 2013, entitled "Oxidation-Resistant Coated Superalloy", now abandoned, which claims benefit of U.S. Patent Application No. 61/691,223, filed Aug. 20, 2012, U.S. Patent Application No. 61/720,155, filed Oct. 30, 2012, and U.S. Patent Application No. 61/785,596, filed Mar. 14, 2013, all entitled "Oxidation-Resistant Coated Superalloy", the disclosures of which five applications are incorporated by reference in their entireties herein as if set forth at length.

BACKGROUND

The disclosure relates to high temperature nickel-based superalloys. More particularly, the disclosure relates to oxidation resistant superalloy coatings for such superalloys.

A long-developed field has existed in turbine engine turbine blade metallurgy. Cast single-crystal nickel-based superalloys are used for turbine section blades in gas turbine engines. Such alloys are notoriously subject to oxidation and require oxidation-resistant coatings. However, many coatings exhibit excessive secondary reaction zone (SRZ) formation with the substrate material.

Prior blade substrate and coating combinations that have been proposed include those in US Pub. Nos. 2006/0093851 A1, 2009/0075115 A1, and 2009/0274928 A1. Metallic coatings may be the outermost layer (subject to oxidation layers, etc.) or may be bond coats for ceramic thermal barrier coatings (TBC) deposited thereatop.

SUMMARY

One aspect of the disclosure involves a coating-substrate combination involving a Ni-based superalloy substrate comprising, by weight percent: 2.0-5.1 Cr; 0.9-3.3 Mo; 3.9-9.8 W; 2.2-6.8 Ta; 5.4-6.5 Al; 1.8-12.8 Co; 2.8-5.8 Re; 2.8-7.2 Ru; and a coating comprising, exclusive of Pt group elements, by weight percent: Ni as a largest content; 5.8-9.3 Al; 4.4-25 Cr; 3.0-13.5 Co; up to 6.0 Ta, if any; up to 6.2 W, if any; up to 2.4 Mo, if any; 0.3-0.6 Hf; 0.1-0.4 Si; up to 0.6 Y, if any; up to 0.4 Zr, if any; up to 1.0 Re, if any.

One aspect of the disclosure involves a coating-substrate combination involving a Ni-based superalloy substrate comprising, by weight percent: 2.0-6.0 Cr; 0.5-4.0 Mo; 3.0-10.0 W; 2.0-7.0 Ta; 5.0-7.0 Al; 1.0-14.0 Co; 2.0-6.0 Re; 1.0-8.0 Ru; and a coating comprising, exclusive of Pt group elements, by weight percent: Ni as a largest content; 5.0-11.0 Al; 3.0-25 Cr; 3.0-17.0 Co; up to 7.0 Ta, if any; up to 6.2 W, if any; up to 3.0 Mo, if any; 0.05-0.7 Hf; 0.1-0.4 Si; up to 0.7 Y, if any; up to 0.7 Zr, if any; up to 1.0 Re, if any.

In additional or alternative embodiments of any of the foregoing embodiments, the coating comprises exclusive of Pt group elements, by weight percent: 0.4-0.6 said Hf; 0.2-0.4 said Si.

In additional or alternative embodiments of any of the foregoing embodiments, the coating has less than 1.0 weight percent overall said Pt group elements combined.

In additional or alternative embodiments of any of the foregoing embodiments, in weight percent exclusive of Pt group elements, the coating has less than 1.0 weight percent individually other elements.

In additional or alternative embodiments of any of the foregoing embodiments, the substrate falls within one of the broader ranges of Table VI; and the coating falls within the associated broader range of Table VI.

In additional or alternative embodiments of any of the foregoing embodiments, the coating and substrate fall within the narrower associated ranges.

In additional or alternative embodiments of any of the foregoing embodiments, the coating has said weight percent combined of said Y, Hf, Zr, and Si of 0.5-1.5 weight percent.

In additional or alternative embodiments of any of the foregoing embodiments, the coating has 3.0-5.8 said weight percent Ta; and the coating has combined contents, if any, of no more than 6.5% by weight Ru, said Ta, and said Re.

In additional or alternative embodiments of any of the foregoing embodiments, the coating has less than 0.50 weight percent Ru, if any.

In additional or alternative embodiments of any of the foregoing embodiments, the coating has less than 0.50 or 0.10 said weight percent Re, if any.

In additional or alternative embodiments of any of the foregoing embodiments, a ratio of said substrate weight percent Re to said coating weight percent Re, if any, is in excess of 10.0.

In additional or alternative embodiments of any of the foregoing embodiments, a SRZ, if any, is less than 0.001 inch (0.025 mm) thick.

In additional or alternative embodiments of any of the foregoing embodiments, the article/substrate may be a single crystal alloy such as a turbine blade.

In additional or alternative embodiments of any of the foregoing embodiments, the substrate has a density of 0.315-0.327 pounds per cubic inch (8.72-9.05 g/cm$^3$).

Another aspect of the disclosure involves an article comprising: a Ni-based superalloy substrate comprising, by weight percent: 4.0-6.0 Cr; 1.0-2.0 Mo; 5.0-6.0 W; 5.0-6.0 Ta; 5.0-6.0 Al; 5.0-7.0 Co; 5.0-6.0 Re; 2.0-3.0 Ru; and a coating comprising, exclusive of Pt group elements, by weight percent: Ni as a largest content; 5-11 Al; 3-15 Cr; 9-16 Co; up to 7 Ta, if any; up to 6 W, if any; up to 3 Mo, if any; 0.05-0.7 Hf; 0.1-0.5 Si; up to 0.7 Y, if any; up to 0.7 Zr, if any; up to 1.0 Re, if any.

Another aspect of the disclosure involves an article comprising: a Ni-based superalloy substrate comprising, by weight percent: 2.0-3.0 Cr; 2.0-4.0 Mo; 8.0-10.0 W; 2.0-3.0 Ta; 6.0-7.0 Al; 6.0-8.0 Co; 4.0-5.0 Re; 6.0-8.0 Ru; and a coating comprising, exclusive of Pt group elements, by weight percent: Ni as a largest content; 5-11 Al; 3-15 Cr; 9-17 Co; up to 7 Ta, if any; up to 6 W, if any; up to 3 Mo, if any; 0.05-0.7 Hf; 0.1-0.5 Si; up to 0.7 Y, if any; up to 0.7 Zr, if any; up to 1.0 Re, if any.

Another aspect of the disclosure involves an article comprising: a Ni-based superalloy substrate comprising, by weight percent: 2.0-3.0 Cr; 1.0-3.0 Mo; 3.0-5.0 W; 3.0-4.0 Ta; 5.0-7.0 Al; 1.0-3.0 Co; 2.0-4.0 Re; 4.0-6.0 Ru; and a coating comprising, exclusive of Pt group elements, by weight percent: Ni as a largest content; 5-11 Al; 3-15 Cr; 9-16 Co; up to 7 Ta, if any; up to 6 W, if any; up to 3 Mo, if any; 0.05-0.7 Hf; 0.1-0.5 Si; up to 0.7 Y, if any; up to 0.7 Zr, if any; up to 1.0 Re, if any.

Another aspect of the disclosure involves an article comprising: a Ni-based superalloy substrate comprising, by weight percent: 2.0-3.0 Cr; 2.0-3.0 Mo; 7.0-9.0 W; 2.0-4.0

Ta; 5.0-6.0 Al; 7.0-9.0 Co; 3.0-5.0 Re; 4.0-6.0 Ru; and a coating comprising, exclusive of Pt group elements, by weight percent: Ni as a largest content; 5-11 Al; 3-15 Cr; 9-17 Co; up to 7 Ta, if any; up to 6 W, if any; up to 3 Mo, if any; 0.05-0.7 Hf; 0.1-0.5 Si; up to 0.7 Y, if any; up to 0.7 Zr, if any; up to 1.0 Re, if any.

Another aspect of the disclosure involves an article comprising: a Ni-based superalloy substrate comprising, by weight percent: 3.0-4.0 Cr; 0.5-2.0 Mo; 6.0-8.0 W; 4.0-5.0 Ta; 5.0-7.0 Al; 1.0-3.0 Co; 4.0-5.0 Re; 3.0-5.0 Ru; and a coating comprising, exclusive of Pt group elements, by weight percent: Ni as a largest content; 5-11 Al; 3-15 Cr; 9-17 Co; up to 7 Ta, if any; up to 6 W, if any; up to 3 Mo, if any; 0.05-0.7 Hf; 0.1-0.5 Si; up to 0.7 Y, if any; up to 0.7 Zr, if any; up to 1.0 Re, if any.

Other aspects involve methods for using the article comprising: heating the article to a temperature of at least 2000 F (1093 C) for at least 400 hours while an SRZ, if any, remains less than 0.002 inch (0.05 mm) thick.

Other aspects involve methods for forming the article.

The details of one or more embodiments are set forth in the accompanying drawings and the description below. Other features, objects, and advantages will be apparent from the description and drawings, and from the claims.

BRIEF DESCRIPTION OF THE DRAWINGS

FIG. 2 (Table I) is a table of nominal (intended) substrate compositions.

FIG. 3 (Table II) shows nominal (intended) coating compositions.

FIG. 4 (Table III) is a table of measured substrate compositions.

FIG. 5 (Table IV) is a table of measured coating compositions.

FIGS. 6A and 6B in serial combination (collectively FIG. 6) (Table V) are a table of predicted and observed SRZ formation.

FIGS. 13A-13D in serial combination (collectively FIG. 13) (Table VI) are a table of elemental tolerances for specifications of hypothesized individual substrates for substrate-coating pairs.

FIGS. 14A and 14B in serial combination (collectively FIG. 14) (Table VII) are a table of elemental tolerances for specifications of hypothesized individual coatings for substrate-coating pairs.

FIGS. 15A-15D in serial combination (collectively FIG. 15) (Table VIII) are a table of elemental tolerances for coatings for hypothesized substrate-coating pairs.

Like reference numbers and designations in the various drawings indicate like elements.

DETAILED DESCRIPTION

Figure 1:
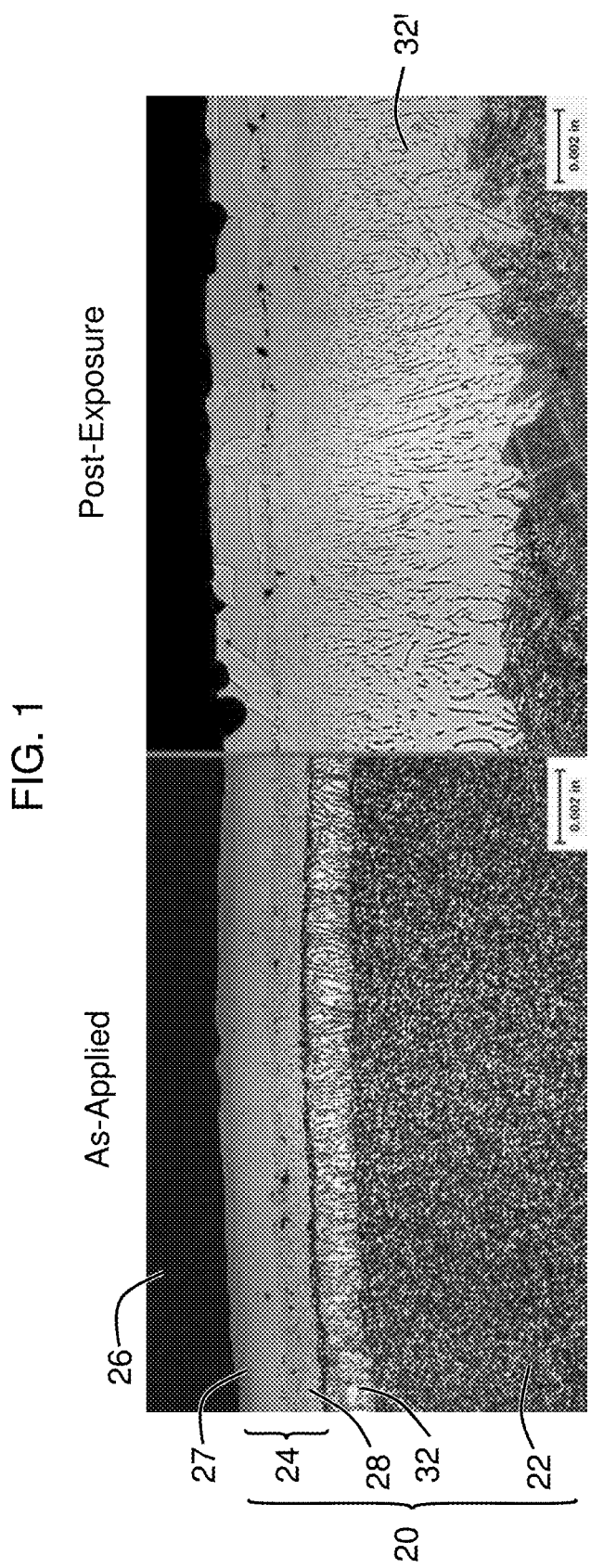
FIG. 1 is a pair of sectional photomicrographs of a first superalloy substrate/aluminide coating combination in an as-applied condition (left) and a post-exposure condition (right).
Figure 8:
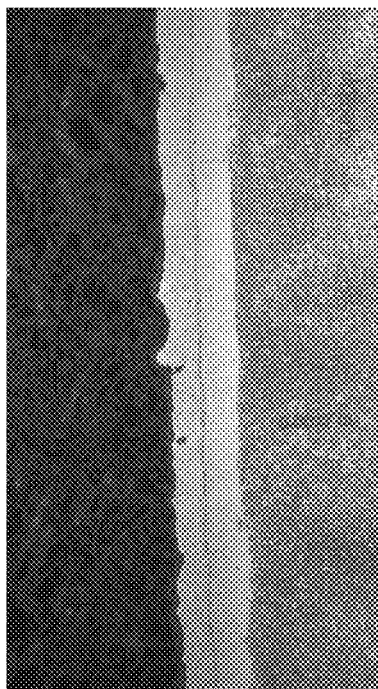
FIGS. 7-12 are respective sectional photomicrographs of second through seventh superalloy substrate/superalloy coating combinations in a post-exposure condition.
Figure 10:
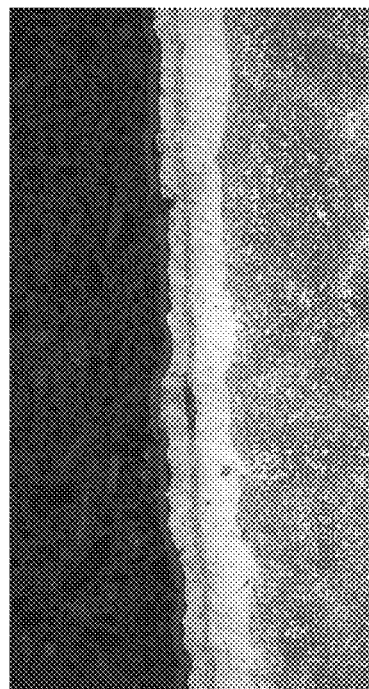
Figure 7:
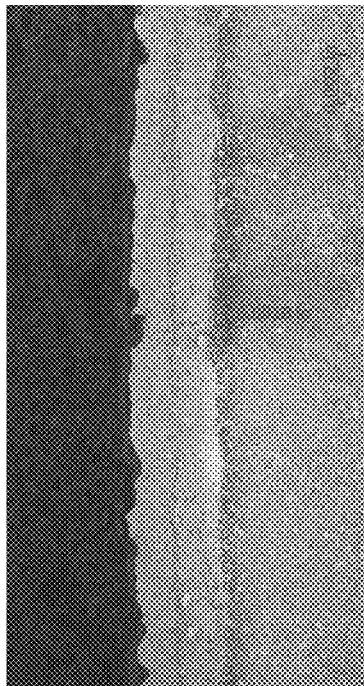
Figure 9:
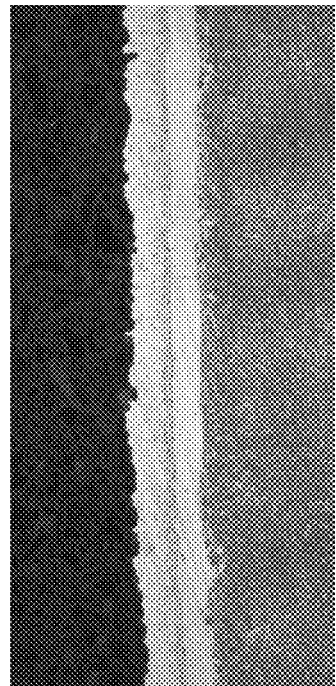

FIG. 1 shows an article 20 comprising a Ni-based single crystal substrate 22 with a Ni-based coating 24 thereatop. In this example, the substrate is TMS-162 and the coating is MDC-150L (Alcoa Howmet Thermatech Coatings, Whitehall, Mich., US). An epoxy mount for the sectioning is shown as 26. The coating 24 is applied directly to the exposed surface of substrate (e.g., via a physical vapor deposition (PVD) process such as cathodic arc deposition). With an exemplary attempt at an oxide-resistant coating (e.g., FIG. 1, although not necessarily prior art) one sees the substrate 22 and the coating 24.

The coating 24 is further divided into regions including an additive zone 27 and a diffusion zone 28 below the additive zone (representing substrate material into which additive coating material has diffused). Exemplary as-applied thickness is 0.002-0.004 inch (0.05-0.10 mm), more broadly, 0.001-0.006 inch (0.025-0.15 mm). An oxide layer at the coating surface may be just perceptible.

A highly columnar secondary reaction zone (SRZ) 32 has a thickness which may exceed 0.001 inch (0.025 mm). The SRZ is widely accepted as being a brittle P-phase that causes unacceptable reductions in mechanical properties such as fatigue and creep (See, e.g., W. S. WALSTON et al., "A New Type of Microstructural Instability in Superalloys-SRZ", Superalloys 1996, published Sep. 1, 1996, pages 9-18, The Minerals, Metals & Materials Society, Warrendale, Pa. and O. LAVIGNE et al., "Relationships Between Microstructural Instabilities and Mechanical Behaviour in New Generation Nickel-Based Single Crystal Superalloys", Superalloys 2004, published Jan. 1, 2006, pages 667-675, The Minerals, Metals & Materials Society, Warrendale, Pa.).

The exemplary post-exposure micrographs in FIG. 1 and further figures below reflect heating in air at ambient pressure to a temperature of 2000 F (1093 C) for a period of 400 hours. The SRZ 32' has expanded to a thickness in excess of 0.005 inch (0.13 mm). The expanded SRZ 32' more greatly compromises strength properties.

Table I (FIG. 2) shows nominal (intended) substrate compositions. These represent a select group of high-Re, high creep-resistance materials. Table II (FIG. 3) shows nominal (intended) coating compositions. These and particular combinations thereof were selected based upon an analytical model to predict the formation of SRZ. In an initial experimental calibration step, EPMA elemental composition depth profiles are performed on selected actual coating/alloy couples both in the as-coated and post-exposure conditions to calibrate the diffusion model. Alloy/coating couples are selected to provide a wide range of degrees of SRZ formation. In a simulation calibration step, Thermo-Calc™ and DICTRA™ software (both of Thermo-Calc Software, Stockholm, Sweden), using both thermodynamic and mobility databases, are used to determine the evolution of the different phase fractions with depth, from the surface of the coating, through the inter-diffusion zone and to well inside the substrate. Experimental depth profiles from Phase 1 are used to calibrate the databases to match more closely actual interaction between the types coating and alloys at stake. In an experimental validation step, more experimental coating/alloy couples are evaluated for their level of SRZ formation, but with no depth profile: only average actual composition of both coating and alloy are used to link the couple to the SRZ formation metric. In a simulation validation step, blind simulations are performed to validate the performance of the calibrated software on coating/alloy couples with known level of SRZ formation by the experimental team, but unknown to the simulation team. Thereafter, a statistical analysis includes formulating a statistical model followed by supplementary diffusion simulations aimed at producing optimized input for the multiple regression model. This is used to define possible preferred alloy and coating combinations. Thereafter, these preferred alloy and coating combinations are ultimately used for validation of the regression model predictions with SRZ evaluation pre- and post-exposure. The observance of SRZ and/or measurement of other mechanical properties may be used to determine satisfactory combinations.

Because the manufacture process is subject to some uncertainty, the actual compositions differed from the intended compositions. Tables III (FIG. 4) and IV (FIG. 5), respectively are measured substrate and coating compositions. Hf was measured for only two. Hf in the substrate helps increase oxidation resistance. Exemplary Hf content is about 0.15 weight percent (which may be a nominal target content), more broadly, 0.10-0.20, or more broadly 0.1-0.2.

The Table IV coating composition was determined on the coating itself with microprobe analysis, as-coated, before exposure. It is noted that coating composition will differ from ingot composition due to differential proportions of different elements in the ingot depositing on the substrate. These relative deposition efficiencies depend on factors including the particular materials, deposition apparatus, operating parameters and the like. Based upon know effects of such factors, an ingot composition can be determined for a desired coating composition, subject to some error and possible trial and error adjustment. For a typical blade, coating composition will reflect the pre-exposure values until the blade is used (unless a pre-use exposure is applied to the blade). For the foregoing reasons, as-applied coating measurements are used rather than ingot or post-exposure values/measurements.

Table V (FIG. 6) shows numbers the model generated as predictive of the presence of SRZ as well as a characterization of observed extent of SRZ formation of the coatings of Table IV on the substrates of Table III, after exposure.

FIGS. 7-10 each show as-applied and post-exposure conditions of several of the Table V combinations. As is noted above, these combinations may represent the final article (e.g., a cast single-crystal nickel-based superalloy blade) or there may be additional coating layers such as a ceramic thermal barrier coating (TBC) deposited thereatop. Exemplary TBC includes a ceramic layer made of partially-stabilized zirconia or a ceramic layer that has a thermal conductivity of less than zirconia stabilized by about seven weight percent yttria (7YSZ). In yet another variation, a platinum group metal may be applied (e.g., plated) to the substrate prior to coating application. After any heat treatment or use, diffusion of the one or more platinum group elements into the coating applied thereatop may leave the resultant coating with up to 60% (by weight) of said at least one platinum group metal to further enhance oxidation resistance of the coating. The remaining non-platinum group elements would remain substantially in the same proportions as in the tables. Platinum group metals will diffuse into the coating at much lower temperatures than the exposure/use temperatures. In a further variation, such platinum may be applied after the coating is applied and then diffused into the coating (thereafter, a ceramic coating, if any, may be applied).

From FIGS. 6-10, it is clear that we have demonstrated at least the core of a space of coating-substrate combinations having advantageous properties of lack of SRZ formation in creep-resistant SX alloys.

Figure 11:
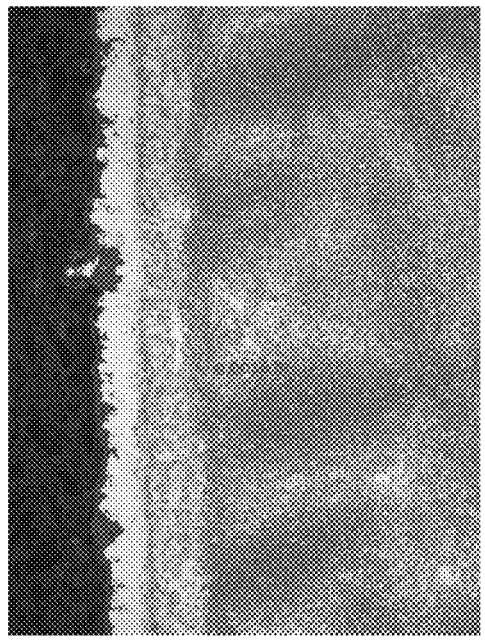

FIG. 11 shows one of the borderline SRZ formation entries from Table V. It is characterized as borderline because of the multi-phase, columnar nature of at least part of the alloy-coating interdiffusion zone, but not as clearly discernable as what was observed on FIG. 1 or FIG. 12 in the post-exposure condition. This manifests itself as a greater visible difference between the additive zone and the diffusion zone.

Figure 12:
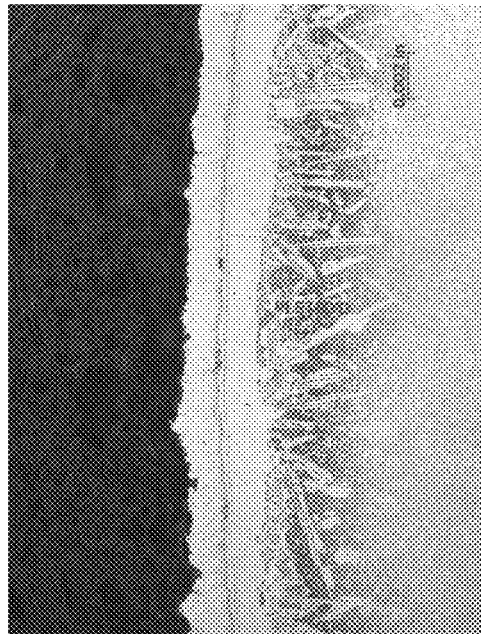

FIG. 12 shows one of the observed SRZ formation combinations. The morphology of the SRZ, however, apparently differs from FIG. 1.

In contrast, US 2009/0274928 A1 appears to largely involve relatively low-Cr and high-Re coating contents which may be conceding oxidation resistance to provide compatibility between coating and substrate. The foregoing examples, however, now demonstrate an alternative to such tradeoff. Rhenium and ruthenium in a coating are expensive and losses during deposition are inevitable. Losses may be particularly significant with thermal spray techniques (which were probably used in US2008/0274928 because of the presence of Amdry™ 9954 (Sulzer Metco, Inc., Westbury, N.Y.), a powder used for thermal spray). Having no or low Re and Ru provides a lower cost coating.

US2009/0075115 A1 identifies a transition metal layer between substrate and bond coat to prevent reaction. U.S. Pat. Nos. 6,306,524, 6,720,088, and 6,921,586 disclose a Ru-containing diffusion barrier at the interface to locally reduce the mobility of elements known to increase the probability of SRZ formation. Similarly, U.S. Pat. No. 6,746,782 proposes a combination of chromium, rhenium, tungsten, or ruthenium to act as a diffusion barrier. The foregoing examples, however, now demonstrate an alternative to such requirement. The present examples are selected to provide both thermodynamic and diffusion kinetics between the alloys and the coatings that prevent formation of deleterious SRZ phase.

US 2006/0093851 A1 adopted a nickel aluminide coating with relatively low content in chromium. The coatings in present FIG. 3 mostly have higher content in chromium, which is known to be beneficial to both oxidation and hot corrosion resistance, while also being resistant to SRZ formation when deposited on most of the proposed alloys.

One characterization of the coating-substrate space involves a Ni-based superalloy substrate comprising, by weight percent: 2.0-5.1 Cr; 0.9-3.3 Mo; 3.9-9.8 W; 2.2-6.8 Ta; 5.4-6.5 Al; 1.8-12.8 Co; 2.8-5.8 Re; 2.8-7.2 Ru; and a coating comprising, exclusive of Pt group elements, by weight percent: Ni as a largest content; 5.8-9.3 Al; 4.4-25 Cr; 3.0-13.5 Co; up to 6.0 Ta, if any; up to 6.2 W, if any; up to 2.4 Mo, if any; 0.3-0.6 Hf; 0.1-0.4 Si; up to 0.6 Y, if any; up to 0.4 Zr, if any; up to 1.0 Re, if any. Although Table III does show some examples in this space as having SRZ formation, that only confirms the otherwise unexpected nature of the benefits of the space as a whole.

Furthermore, exemplary coating combined content of the reactive elements Y, Hf, Zr, and Si is 0.5-2.0 weight percent, more particularly, it may be 0.5-1.5 weight percent or 0.5-1.0 weight percent. Reactive element ranges serve (individually and combined) to provide enough oxidation resistance (reason for min. value) without forming deleterious phases for oxidation if there is too much (reason for max. value). Also, modeling indicates a particular combined tantalum and tungsten content to tailor the coating physical properties to the alloy's, while controlling the SRZ formation and maximize oxidation resistance of the coating. The model indicates a binary situation in weight percent where either $6.0 \leq W+Ta \leq 13.0$ or $Ta+W \leq 0.05$. The model also indicates further characterizations of chromium and nickel weight percent content where $55.0 \leq Ni+Cr \leq 67.0$ and $Ni \geq 52$ in the coating and Cr weight percent in the coating is at least the same as Cr weight percent in the substrate. Any of the FIG. 13/14 or FIG. 15 combinations discussed below may further be modified by one-to-all or any combination of these relationships. Again, if platinum group elements are present, the relationships would apply excluding such elements as noted above.

Exemplary substrate density is of 0.310-0.328 pounds per cubic inch (8.58-9.08 g/cm$^3$), more particularly, 0.315-0.327 pounds per cubic inch (8.72-9.05 g/cm$^3$). Exemplary substrate creep resistance (which, however, might not be achieved by some of the tested alloys) is at least 50 F (28 C) greater than that of PWA1484 (balance Ni plus impurities and weight percent: 5 Cr; 10 Co; 1.9 Mo; 5.9 W; 8.7 Ta; 5.65 Al; 0.1 Hf; 3 Re, 8.95 g/cm$^3$). At least 50 F (28 C) over PWA 1484 means that whatever the rupture life of PWA 1484 at a given temperature and stress, the subject alloy would have the same life at the same stress and at least a 50 F (28 C) higher temperature. In practice, at the 1800 F/45 ksi (982° C. & 310 MPa) test condition, the 50 F (28 C) improvement would likely be associated with at least 234 hour rupture life (using an estimated 75.0 hour compromise of the 85.0 hour and 59.4 hour figures in Table IX). Table IX also shows data for CMSX-4® alloy of Cannon-Muskegon Corporation, Muskegon, Mich. ((balance Ni plus impurities and weight percent: 6.5 Cr; 9 Co; 0.6 Mo; 6 W; 6.5 Ta; 5.6 Al; 0.1 Hf; 3 Re, 8.70 g/cm$^3$).

Returning to Table III of FIG. 4, it is seen that CPW-V1, has a much lower density than PWA 1484; CPW-V2, 6, 9, and 10 have a moderately lower density; and CPW-V3, 4, 7, 8, and 11 have slightly lower to slightly higher density. From the partial date in Table IX, it is seen that there is a tradeoff in density and strength. With density much lower than PWA 1484 ((e.g., 0.313-0.318 pounds per cubic inch (8.66-8.80 g/cm$^3$)), one might accept up to a 25 F (14 C) reduction in creep capability. With density moderately lower than PWA 1484 ((e.g., 0.319-0.321 pounds per cubic inch (8.83-8.89 g/cm$^3$)), up to a 25 F (14 C) increase in creep capability would present a clear advantage over PWA 1484. With density slightly lower to slightly higher than PWA 1484 ((e.g., 0.322-0.326 pounds per cubic inch (8.91-9.02 g/cm$^3$)), greater than 30 F (17 C), more particularly greater than 40 F (22 C) or greater than 50 F (28 C), increase in creep capability would also present a clear advantage over PWA 1484.

TABLE IX

Alloy Rupture Life under Test Conditions

| Alloy | Rupture Life (Hours) | |
|---|---|---|
| | 1800° F. & 45 ksi (982° C. & 310 MPa) | 2000° F. & 20 ksi (982° C. & 138 MPa) |
| PWA 1484* | 85.0 | 220 |
| PWA 1484 | 59.4 | 151 |
| CMSX-4 ®** | 74.0 | 129 |
| CPW-V1 | 51.1 | 36.8 |
| CPW-V2 | 127 | 566 |
| CPW-V3 | 169 | 700 |
| CPW-V4 | 189 | 166 |
| CPW-V5 | 157 | 174 |
| CPW-V6 | 147 | 176 |
| CPW-V7 | 127 | 70 |
| CPW-V8 | 152 | 280 |
| CPW-V9 | 121 | 351 |
| CPW-V10 | 155 | 132 |
| CPW-V11 | 159 | 307 |
| Min. 1 | 40 | 30 |
| Min. 2 | 80 | 200 |

TABLE IX-continued

Alloy Rupture Life under Test Conditions

| Alloy | Rupture Life (Hours) | |
|---|---|---|
| | 1800° F. & 45 ksi (982° C. & 310 MPa) | 2000° F. & 20 ksi (982° C. & 138 MPa) |
| Min. 3 | 100 | 400 |
| Min. 4 | 120 | 500 |
| Min. 5 | 150 | 600 |

*Historical data from a different testing house than the remaining data.
**Trademark of Cannon-Muskegon Corporation, Muskegon, Michigan.

Exemplary Min. values are given associated with various levels of performance relative to PWA 1484. Rather than using hours, alternative Min. values may be expressed relative to the PWA 1484 figures as a percentage (or fractional) increase or decrease at either or both of the two measurement conditions given.

If individual specifications are made for the substrate, coating, or substrate coating pairs, exemplary tolerances around the substrates and coatings for the particular SRZ-free examples are shown in Tables VI and VII of FIGS. 13 and 14. Levels of other elements (whether Pt group or impurities) may be at exemplary levels mentioned above and in the claims.

Further combinations are seen in Table VIII of FIG. 15 wherein individual of the named substrates and several groups of the named substrates are respectively characterized by two levels of composition breadth. Based upon modeling, coating composition range for beneficial lack of SRZ formation is given as are two levels of composition breadth associated with a combination of such lack of SRZ formation and oxidation resistance. The nominal "0" maximum values may be regarded as including up to impurity levels but would typically be less than 0.1 or 0.05. Any of the four range combinations for a given substrate-coating combination may be used as an alternative characterization.

Where a measure is given in English units followed by a parenthetical containing SI or other units, the parenthetical's units are a conversion and should not imply a degree of precision not found in the English units.

One or more embodiments have been described. Nevertheless, it will be understood that various modifications may be made. For example, when implemented as a replacement for a baseline substrate/coating system in a given application, details of the baseline and application may influence details of any particular implementation. Accordingly, other embodiments are within the scope of the following claims.

What is claimed is:

1. An article comprising:
    a Ni-based superalloy substrate comprising, by weight percent: 2.0-5.1 Cr; 0.9-3.3 Mo; 3.9-9.8 W; 2.2-6.8 Ta; 5.4-6.5 Al; 1.8-12.8 Co; 2.8-5.8 Re; 2.8-7.2 Ru; and
    a coating comprising, exclusive of Pt group elements, by weight percent: Ni as a largest content; 7.4-9.0 Al; 9.3-11.9 Cr; 7.4-9.0 Co; 0.0 Ta; 0.0 W; 0.0 Mo; 0.1-0.5 Hf; 0.1-0.3 Si; 0.3-0.6 Y; 0.1-0.5 Zr; and 0.0 Re,
    wherein:
        the coating has less than 0.50 weight percent Ru, if any; and
        in weight percent exclusive of Pt group elements, the coating has less than 1.0 weight percent individually elements other than said Ni, Al, Cr, Co, Ta, W, Mo, Hf, Si, Y, Zr, Re, Ru, and Pt group elements, if any.
2. The article of claim 1 wherein:
    the substrate comprises 0.05-0.7 weight percent Hf.

3. The article of claim 1 wherein:
the substrate has a 1800° F. & 45 ksi (982° C. & 310 MPa) rupture life of at least 120 hours.

4. The article of claim 1 wherein:
the substrate is a single crystal alloy.

5. The article of claim 1 wherein:
the coating has less than 1.0 weight percent overall said Pt group elements combined.

6. The article of claim 1 wherein:
in weight percent the coating has 55.0≤Ni+Cr≤67.0 and Ni≥52.

7. The article of claim 1 wherein:
the coating has said weight percent combined of said Y, Hf, Zr, and Si of up to 1.5 weight percent.

8. The article of claim 1 wherein:
a SRZ, if any, is less than 0.001 inch (0.025 mm) thick.

9. The article of claim 1 being a turbine blade.

10. The article of claim 1 wherein at least one of:
the substrate is a single crystal alloy;
the substrate has a density of 0.315-0.327 pounds per cubic inch (8.72-9.05 g/cm³); and
the substrate has a creep resistance of at least 50° F. (28° C.) greater than that of PWA1484.

11. An article comprising:
a Ni-based superalloy substrate comprising, by weight percent: 2.0-3.0 Cr; 2.0-3.0 Mo; 7.0-9.0 W; 2.0-4.0 Ta; 5.0-6.0 Al; 7.0-9.0 Co; 3.0-5.0 Re; 4.0-6.0 Ru; and
a coating comprising, exclusive of Pt group elements, by weight percent: Ni as a largest content; 6.3-7.7 Al; 4.1-5.3 Cr; 11.8-14.2 Co; 5.0-6.2 Ta; 4.3-5.3 W; 0.0 Mo; 0.1-0.5 Hf; 0.2-0.4 Si; 0.3-0.7 Y; 0.0 Zr; and 0.0 Re,
wherein:
in weight percent exclusive of Pt group elements, the coating has less than 1.0 weight percent individually elements other than said Ni, Al, Cr, Co, Ta, W, Hf, Si, Y, and Pt group elements, if any.

12. An article comprising:
a Ni-based superalloy substrate comprising, by weight percent: 2.0-5.1 Cr; 0.9-3.3 Mo; 3.9-9.8 W; 2.2-6.8 Ta; 5.4-6.5 Al; 1.8-12.8 Co; 2.8-5.8 Re; 2.8-7.2 Ru; and
a coating comprising, exclusive of Pt group elements, by weight percent: Ni as a largest content; 6.3-7.7 Al; 4.1-5.3 Cr; 11.8-14.2 Co; 5.0-6.2 Ta; 4.3-5.3 W; 0.0 Mo; 0.1-0.5 Hf; 0.2-0.4 Si; 0.3-0.7 Y; 0.0 Zr; and 0.0 Re,
wherein:
the coating has less than 0.50 weight percent Ru, if any; and
in weight percent exclusive of Pt group elements, the coating has less than 1.0 weight percent individually elements other than said Ni, Al, Cr, Co, Ta, W, Mo, Hf, Si, Y, Zr, Re, Ru, and Pt group elements, if any.

13. The article of claim 12 wherein:
the substrate comprises 0.05-0.7 weight percent Hf.

14. The article of claim 12 wherein:
the substrate has a 1800° F. & 45 ksi (982° C. & 310 MPa) rupture life of at least 120 hours.

15. The article of claim 12 wherein:
a SRZ, if any, is less than 0.001 inch (0.025 mm) thick.

16. The article of claim 12 being a turbine blade.

17. The article of claim 12 wherein at least one of:
the substrate is a single crystal alloy;
the substrate has a density of 0.315-0.327 pounds per cubic inch (8.72-9.05 g/cm³); and
the substrate has a creep resistance of at least 50° F. (28° C.) greater than that of PWA1484.

18. The article of claim 12 wherein:
the coating has less than 1.0 weight percent overall said Pt group elements combined.

19. The article of claim 12 wherein:
the substrate is a single crystal alloy.

* * * * *